(12) United States Patent
Melanson

(10) Patent No.: US 6,724,332 B1
(45) Date of Patent: Apr. 20, 2004

(54) NOISE SHAPING CIRCUITS AND METHODS WITH FEEDBACK STEERING OVERLOAD COMPENSATION AND SYSTEMS USING THE SAME

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/217,368

(22) Filed: Aug. 13, 2002

(51) Int. Cl.$^7$ .............................. H03M 3/00; H03M 1/66
(52) U.S. Cl. ........................................ 341/143; 341/144
(58) Field of Search ............................... 341/143, 144, 341/155, 118, 120; 375/346

(56) References Cited

U.S. PATENT DOCUMENTS

| | | | | |
|---|---|---|---|---|
| 5,055,843 A | * | 10/1991 | Ferguson et al. | 341/143 |
| 5,103,228 A | * | 4/1992 | Voorman et al. | 341/143 |
| 5,243,345 A | * | 9/1993 | Naus et al. | 341/143 |
| 5,248,972 A | * | 9/1993 | Karema et al. | 341/143 |
| 5,742,246 A | * | 4/1998 | Kuo et al. | 341/143 |
| 6,064,326 A | * | 5/2000 | Krone et al. | 341/143 |
| 6,150,969 A | * | 11/2000 | Melanson | 341/143 |
| 6,331,833 B1 | * | 12/2001 | Naviasky et al. | 341/143 |

* cited by examiner

*Primary Examiner*—Patrick Wamsley
(74) *Attorney, Agent, or Firm*—James J. Murphy; Winstead Sechrest & Minick P.C.

(57) ABSTRACT

A noise shaper includes a first feedback loop for noise shaping a first feedback signal under normal operating conditions and having a first filter with a first signal transfer function and a second feedback loop that is stable under overload conditions and has a second filter having a second signal transfer function differing from the first signal transfer function. The noise shaper also includes an output circuit block including a quantizer and steering circuitry. The quantizer includes an input simultaneously responsive to outputs of the first and second filters. The steering circuitry steers a feedback from an output of the quantizer to input of the first and second feedback loops. The steering circuitry steers feedback from output of the quantizer to inputs of the first and second feedback loops, the steering circuitry including a first output for providing the first feedback signal to the first feedback loop and a second output for providing a second feedback signal to the second feedback loop.

20 Claims, 2 Drawing Sheets

NOISE SHAPING CIRCUITS AND METHODS WITH FEEDBACK STEERING OVERLOAD COMPENSATION AND SYSTEMS USING THE SAME

BACKGROUND OF THE INVENTION

1. Field of Invention

The present invention relates in general to delta-sigma modulators and, in particular, to noise shaping circuits and methods with feedback steering overload compensation and systems using the same.

2. Background of Invention

Delta-sigma modulators are particularly useful in digital to analog converters (DACs) and analog to digital converters (ADCs). Using oversampling, a delta-sigma modulator spreads the quantization noise power across the oversampling frequency band, which is typically much greater than the input signal bandwidth. Additionally, the delta-sigma modulator performs noise shaping by acting as a highpass filter to the quantization noise; most of the quantization noise power is thereby shifted out of the signal band.

The typical delta-sigma modulator in an ADC includes an input summer which sums the analog input signal with negative feedback, an analog linear (loop) filter, a quantizer, and a feedback loop with a digital to analog converter (feedback DAC) coupling the quantizer output and the inverting input of the input summer. A delta-sigma DAC is similar, with a digital input summer, a digital linear filter, a digital feedback loop, a quantizer, and an output DAC at the modulator output: In a first order modulator, the linear filter comprises a single integrator stage; the filter in higher order modulators normally includes a cascade of a corresponding number of integrator stages. Higher-order modulators have improved quantization noise transfer characteristics over modulators of lower order, but stability becomes a more critical design factor as the order increases. For a given topology, the quantizer is either a one-bit or a multiple-bit quantizer.

One cause of instability in digital delta-sigma modulators is input overload. For example, input overload occurs when the gain of the input data is greater than one, when a digitized squarewave with significant Gibbs overshoot is received at the modulator input, or when a bad stream of data is fed from a preceding interpolator. Single-bit delta-sigma modulators are notoriously susceptible to input overload. Multiple-bit delta-sigma modulators are less susceptible to input overload, although overload will still often occur when the input stream approaches its maximum positive and negative levels.

Current techniques for handling overload in delta-sigma modulators are relatively complex and require detection of overload conditions and subsequent resetting or limiting of the modulator circuitry to avoid saturation and instability. However, modulator overload remains an important problem that must be addressed, especially in higher order modulators that provide higher quality noise shaping. Modulator overload is particularly troublesome in audio applications, in which an unstable modulator causes extremes in the output signal that damage the following processing stages and/or result in an unpleasant audible output to the listener.

SUMMARY OF INVENTION

According to the inventive concepts, methods and circuits are disclosed which provide noise shaper immunity to input overload. One representative embodiment of these concepts is a noise shaper including a first filter for noise shaping an input signal under normal operating conditions and a second filter that is stable under overload conditions. A quantizer responds to the sum of the outputs of the first and second filters. Signal steering circuitry steers feedback from the output of the quantizer to inputs of the first and second filters to maintain stability of the first filter under the overload conditions.

Circuits and methods embodying the inventive concepts directly address the problem of noise shaper input overload. When an overload condition occurs, the overload loop receives and bears the increased energy load while the energy being passed by the primary (high quality) noise shaping loop is sustained at a level to maintain primary loop stability. When the overload condition ceases, the primary loop resumes passing the majority of the energy and continues to provide the high quality noise shaping operation. The present invention does not require additional circuitry to either detect overload conditions or reset the noise shaper circuitry to avoid saturating the noise shaper output. Additionally, brief deviations of the input stream outside of the normal maximum limits of the noise shaper input do not substantially disrupt noise shaper operation. These circuits and methods are particularly useful in audio applications in which noise shaper overload causes damage in the following processing stages, such as the audio amplifiers and speakers, and even produce an audible output injurious to the hearing of the listener.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
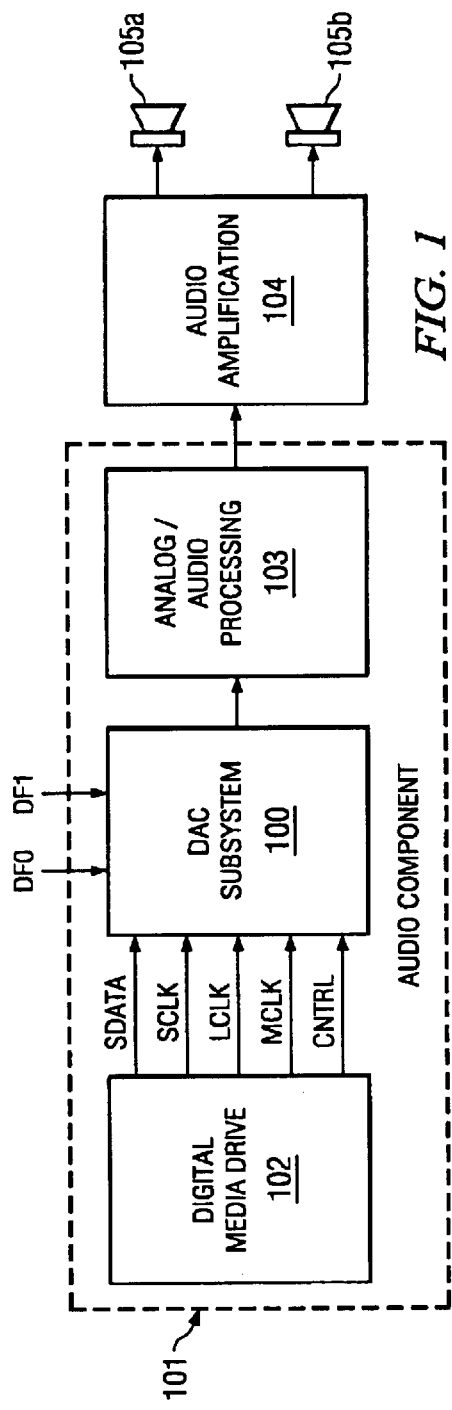
FIG. 1 is a diagram of a representative audio system application of a digital to analog converter (DAC) according to the principles of the present invention.
Figure 2:
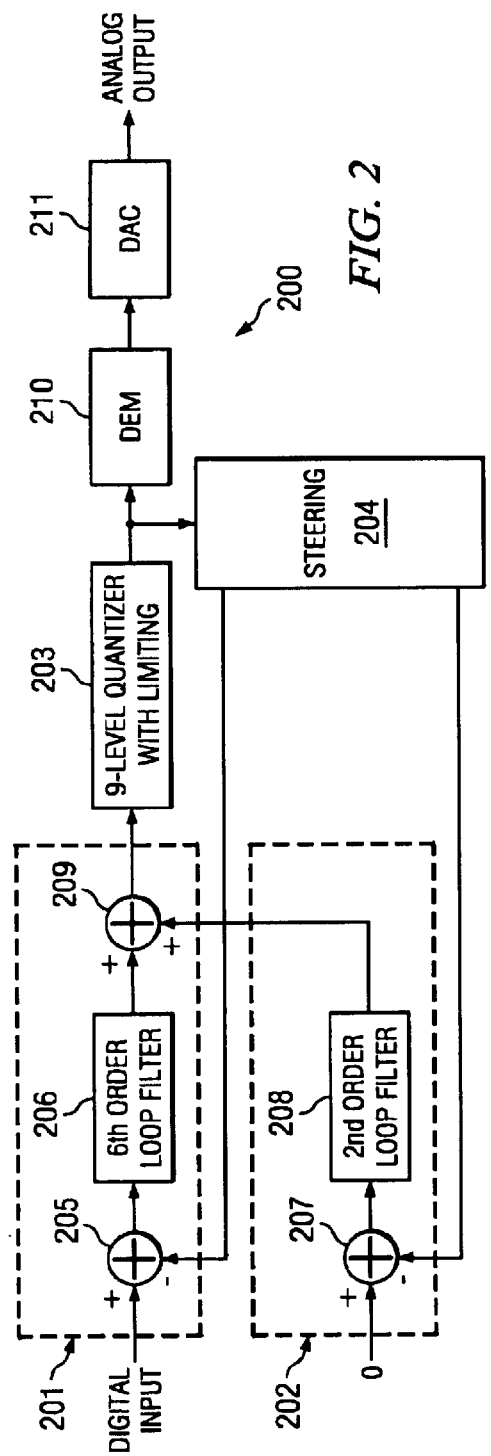
FIG. 2 is a high-level block diagram of an exemplary delta-sigma digital to analog converter (DAC) generally embodying the principles of the present invention and suitable for use in such applications as the DAC shown in the system of FIG. 1.
Figure 3:
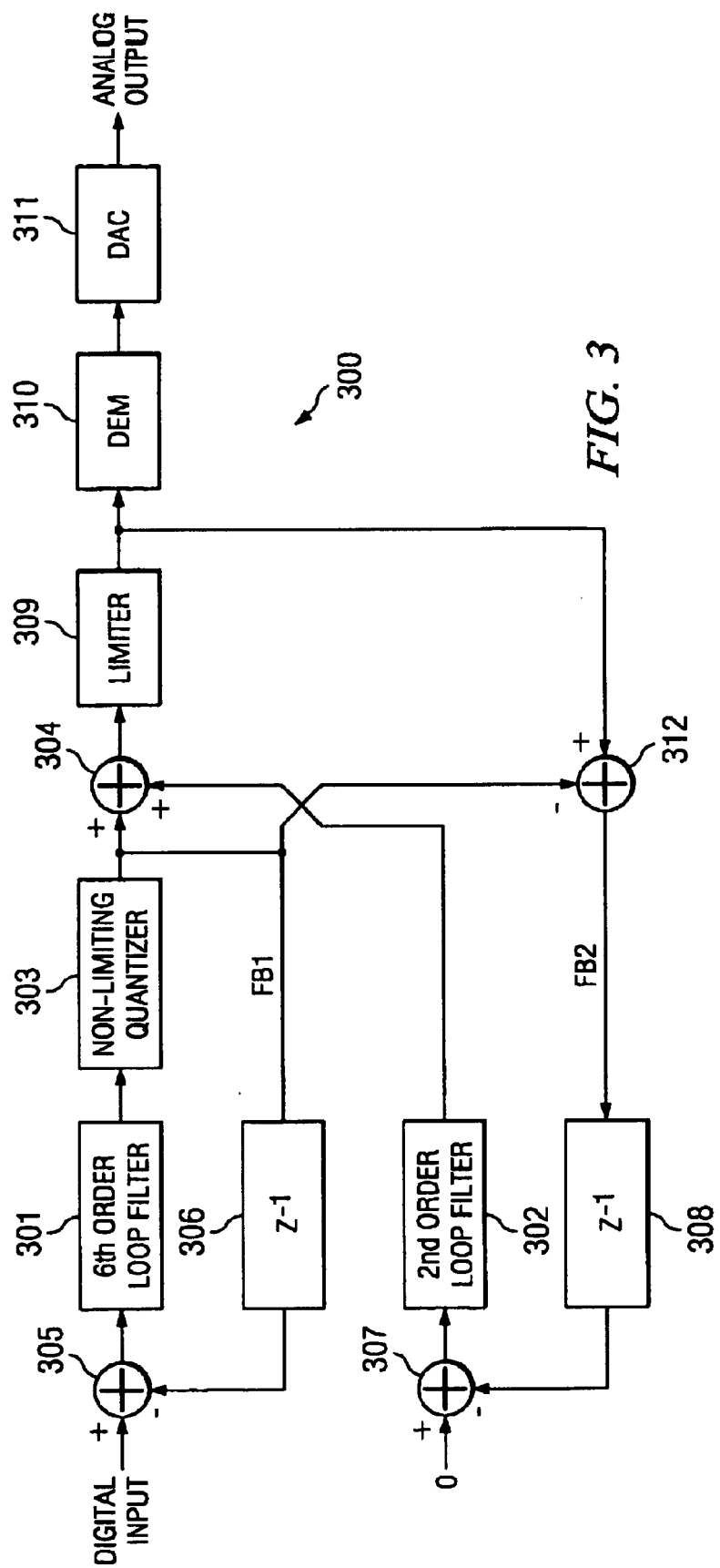
FIG. 3 is an operational block diagram depicting one particular exemplary delta-sigma DAC with feedback steering overload control embodying the principles illustrated by the general example of FIG. 2.

The principles of the present invention and their advantages are best understood by referring to the illustrated embodiment depicted in FIGS. 1–3 of the drawings, in which like numbers designate like parts.

FIG. 1 is a diagram of a typical audio system application of a digital to analog converter (DAC) subsystem 100 according to the principles of the present invention. In this example, DAC subsystem 100 forms part of an audio component 101, such as a compact disk (CD) player, digital audio tape (DAT) player or digital video disk (DVD) unit. A digital media drive 102 recovers the digital data, such as 1-bit audio data in the Sony/Philips 1-bit format or multiple-bit PCM in multiple-bit audio applications, from the given digital data storage media, and passes the data along with clocks and control signals to DAC subsystem 100. The resulting analog (audio) data is further processed in analog/audio processing block 103 prior to amplification in amplifier block 104. Audio amplifier block 104 then drives a set of conventional speakers 105a and 105b, a headset, or similar device.

Digital audio data is received as serial words through the SDATA path timed by the sampling clock (SCLK). The left and right channel data are alternately processed in response to the left-right clock signal (LRCK). The LRCK signal is normally at the same rate as the data input rate (i.e., the sampling rate). The master clock signal (MCLK) synchronizes the overall timing of audio component 101 and has an oversampling frequency of a given multiple of the audio sampling rate. Control signals DF1 and DF0 allow for the selection of the input format, such as a right or left justified format, a 20-bit or 24-bit word width format, etc. . When 1-bit data is being input, the SDATA port receives left channel data and the DF1 port right channel data.

As discussed above, higher order delta-sigma modulators (e.g. third order or higher) typically provide better noise shaping over lower order delta-sigma modulators (e.g. first or second order). However, as the order of the modulator increases, modulator stability becomes a more critical design factor. One particular cause of instability is input overload, in which deviation of the input signal beyond the maximum positive or negative modulator input limits causes one or more of the modulator filter stages to saturate and the entire loop to oscillate.

In typical digital delta-sigma modulators, when the input stream exceeds a given maximum positive or negative value, the quantizer output is driven to its corresponding maximum or minimum value, at which point the throughput data steam is clipped (limited). In turn, the clipped output of the quantizer limits the amount of negative feedback available to the modulator input summer and loop filter. With insufficient feedback, the integrators of the loop filter saturate to their maximum or minimum values, and the modulator becomes unstable. In turn, when the integrator stages saturate, the following circuits, such as the DAC in a delta-sigma digital to analog converter, are overdriven. The result of overdriving is extreme transitions in the analog output signal, which in audio systems may damage the audio speakers and/or cause discomfort or injury to the listener.

One common technique for addressing overload in digital delta-sigma modulators is to reset the integrator stages of the loop filter to zero when overload is detected. Integrator overload detection and reset, however, is relatively difficult to implement. For example, the modulator has to be designed to be immune from disruptions due to occasional brief deviations of the input signal beyond its maximum values and at the same time still detect true overload conditions at the modulator input and reset accordingly.

FIG. 2 is a high-level block diagram of an exemplary delta-sigma digital to analog converter (DAC) 200 with feedback steering overload control embodying the principles of the present invention. DAC 200 is suitable for use in such applications as DAC subsystem 100 of FIG. 1. DAC 200 includes two delta-sigma loops 201 and 202 and a shared quantizer 203. Generally, primary delta-sigma loop 201 is a higher order filter that provides the desired noise shaping operation during normal (low level) operation. Delta-sigma loop 202 generally is a lower order "overload" data path that is unconditionally stable under overload conditions. Steering circuitry 204, which is discussed further below, controls the negative feedback from quantizer 203 to the inputs of delta-sigma loops 201 and 202. By steering the feedback to the inputs of loops 201 and 202, the amount of energy passed through the corresponding loop 201/202 is controlled.

In the illustrated embodiment of DAC 200, primary loop 201 is a sixth ($6^{th}$) order loop and includes an input summer 205, which sums the digital input signal with negative feedback from steering circuitry 204, and also a sixth ($6^{th}$) order primary loop filter 206. Primary loop filter 206 preferably has a conventional topology, such as a feedforward or feedback topology. A general discussion of the design and construction of various delta-sigma loop filter topologies are found in various publications such as Norsworthy et al., *Delta-Sigma Data Converters, Theory, Design and Simulation*, IEEE Press, 1996.

Exemplary overload delta-sigma modulator loop 202 is a second ($2^{nd}$) order loop and includes an input summer 207 summing a fixed input value (in this case zero) with feedback from steering circuitry 204, and also a second ($2^{nd}$) order loop filter 208. Second ($2^{nd}$) order delta-sigma loops are relatively immune to overload and generally straightforward to implement. In other words, second order loop filter designs are able to operate at or up to one hundred percent (%100) of their input range and still remain stable. Additionally, the stability of second order filters in general is provable. Hence, in the illustrated embodiment of DAC 200, a second ($2^{nd}$) order loop 202 is selected for overload loop 202. In general, the state variables of the second order stage are clipped or limited to insure that finite word length registers are able to be used.

The outputs of primary loop 201 and overload loop 202 are summed into shared quantizer 203 by summer 209. In the illustrated embodiment, quantizer 203 is a nine (9)-level quantizer with limiting or truncating capabilities. In illustrated quantizer 203, the maximum positive truncated (quantized) digital output value is plus four (+4) and the maximum negative output value is minus four (−4). Steering circuitry 204 controls two feedback streams: one stream from the output of shared quantizer 203 to input summer 205 of primary loop 201 and another stream to input summer 207 of overload loop 202. The output stream from quantizer 203, which is equal to the sum of the energy of the two feedback streams, drives a conventional switched-capacitor or current steering DAC 211 through dynamic element matching (DEM) circuitry 210. DAC 211 typically has eight (8) elements, which are nominally equivalent to each other, and DEM 210 guarantees equal usage of the elements to remove noise due to mismatch.

In normal operation, quantizer 203 provides an output without clipping and therefore steering circuitry 204 directs the majority of the feedback from quantizer 203 to primary loop 201. Consequently, input summer 205 at the input to $6^{th}$ order loop filter 206 receives sufficient negative feedback to maintain primary loop 201 in the stableoperating regime. In this case, depicted nine-level limiting quantizer 203 outputs digital values in the range of negative four (−4) to positive four (+4). If the modulator input into primary loop 201 remains sufficiently small, feedback values in the range of minus four (−4) to plus four (+4) will provide sufficient feedback to maintain stability of the primary loop 201.

As the input to modulator loop 201 increases and overload approaches, steering circuitry 204 steers sufficient negative feedback to the input of primary loop 201 to maintain stability. At the same time, a compensating level of feedback is sent to the negative input of summer 207 of low-order, unconditionally stable overload loop 202. For example, if the limiting quantizer 203 clips its output at a value of +4, but the input requires feedback with a value of +5 to maintain stability, steering circuitry 204 feeds back a stream with a value of +5 to the input of primary loop 201 and a compensating stream with a value of −1 to the input of overload loop 202. The total value out of feedback steering circuitry 204 thus remains equal to the value out of quantizer 203. In order to minimize signal degradation under overload conditions, the operation of steering circuitry 204 guarantees that the two outputs from steering circuitry 204 sum to the output of quantizer 203. Also, under low signal conditions, a minimal or no amount of the signal is returned to the input of low order modulator loop 202.

In other words, the increased feedback into summer 205 of primary loop 201 sums with the increased (overload) digital input signal of DAC 200 and maintains the stages of primary $6^{th}$ order loop filter 206 out of saturation. The compensating feedback into overload loop 202 increases the energy through loop 202.

Consequently, primary loop 201 is prevented from overloading and remains stable. Overload loop 202 passes the majority of the overload energy but remains stable due to its lower order. When the overload condition ceases, the majority of the feedback energy is redirected to primary loop 202 which returns to generating a high quality output signal. Second ($2^{nd}$) order loop 202 is simple to construct and implement, since it does not have any input signals and only has quantized feedback signals. Therefore, the wordlength of the registers may be made to be very short.

A number of ways exist for implementing feedback steering overload compensation, such as shown in DAC 200 of FIG. 2. FIG. 3 is an operational block diagram depicting one particular exemplary delta-sigma DAC 300 with feedback steering overload control. Delta-sigma DAC 300 includes a high-order ($6^{th}$ order) primary loop filter 301 and a low-order (unconditionally stable) ($2^{nd}$ order) overload loop filter 302. For illustrative purposes, primary loop filter 301 is a sixth ($6^{th}$) order filter, and low order filter 302 is a second ($2^{nd}$) order filter. Again, a second ($2^{nd}$) order topology is selected for low order filter 302 since second ($2^{nd}$) order loop filters are provably stable under overload conditions. In this example, low order filter 302 is the overload filter.

Primary $6^{th}$ order loop filter 301 provides the high quality filtering of the input signal under normal (low level) operating conditions. The signal output of primary loop filter 301 is quantized by a non-limiting quantizer 303, which in turn feeds one input to summer 304. Summer 304 is placed after quantizer 303, as the output of a simple second order loop filter is also an integer since the input is always driven with an integer and hence does not participate in the truncation. The output of non-limiting quantizer 303 also provides negative feedback to input summer 305 to close the primary deltasigma modulator loop, which also includes a delay ($Z^{-1}$) block 306 for signal timing.

A second input to summer 304 is fed by overload filter 302. The input to overload filter 302 is a fixed value, such as a logical zero (0) in this example. The negative feedback to summer 307 from the output of overload filter 302, which is delayed by delay (Z⁻1) element 308, is discussed further below.

The sum of the outputs from respective primary and overload filters 301 and 302 generated by summer 304 is passed through a limiter 309 which performs a clipping (truncation) operation. The resulting output signal from limiter 309 drives DEM circuitry 310 and DAC 311 at the output of DAC 300.

The feedback to input summer 307 is generated by summer 312. The inverting (negative (−))_ input FB1 to summer 312 is driven by the output of non-limiting quantizer 303. The non-inverting (positive (+)) input of summer 312 is driven by the output of limiter 309.

As long as the output from non-limiting quantizer 303 remains below the maximum (positive to negative) output from limiter 309, the overload feedback FB2 from summer 312 remains at zero (0). The majority of the energy is therefore passed through high-quality, $6^{th}$ order loop filter 301. On the other hand, as the output from quantizer 303 exceeds the positive or negative maximum output values from limiter 309, the overload feedback FB2 from summer 312 increases accordingly. The full feedback FB1 from non-limiting quantizer 303 to the input of sixth ($6^{th}$) order loop filter 301 maintains $6^{th}$ order loop filter 301 stable by insuring that the stages of loop filter 301 do not saturate. The overload feedback FB2 to the input of second ($2^{nd}$) order filter 302 ensures that more energy passes through loop filter 302, which remains stable under overload conditions. The total feedback into summers 305 and 307 equals the output from limiter 309.

Other steering mechanisms may also be used in alternate embodiments of the present invention, such as a system that uses the overload filter path only when overload is severely affecting the operation of the main loop filter, but allows short, transient overloads to be clipped in the quantizer. Additionally, the feedback steering may be based upon the level of the input signal.

The principles of the present invention were described above with respect to exemplary digital delta-sigma modulators in exemplary DACs 200 and 300. Feedback steering overload control according to these principles, however, are also applicable to analog delta-sigma modulators and related applications such as analog to digital converters.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A noise shaper comprising:
    a first feedback loop for noise shaping first feedback signal under normal operating conditions and includes a first filter having a first signal transfer function;
    a second feedback loop that is stable under overload conditions and includes a second filter having second signal transfer function differing from the first signal transfer function;
    an output circuit block including a quantizer and steering circuitry; and
    the quantizer having an input simultaneously responsive to outputs of the first and second feedback loops and
    the steering circuitry for steering feedback from an output of the quantizer to inputs of the first and second feedback loops, the steering circuitry including a first output for providing the first feedback signal to the first feedback loop and a second output for providing a second feedback signal to the second feedback loop.

2. The noise shaper of claim 1 wherein the steering circuitry steers a first amount of feedback to the input of the first filter and a second amount of feedback to the second filter under the overload conditions, wherein the first amount of feedback maintains stability of the first filter and a sum of the first and second amounts of feedback substantially equals the output of the quantizer.

3. The noise shaper of claim 1 wherein the first filter has an order of at least three and the second filter has an order of two or less.

4. The noise shaper of claim 1 wherein the quantizer comprises a limiting quantizer limiting a quantized output signal to a maximum level, wherein a sum of the feedback to the input of the first filter and the feedback to the input of the second filter substantially equals the maximum level under the overload conditions.

5. The noise shaper of claim 1 wherein the quantizer comprises a non-limiting quantizer and the steering circuitry comprises:
    a limiter for limiting an output of the non-limiting quantizer to a maximum value;
    a first feedback loop feeding-back an output of the non-limiting quantizer to an input of the first filter; and
    a second feedback loop feeding back a difference of an output of the limiter and the output of the non-limiting quantizer to an input of the second filter.

6. The noise shaper of claim 1 wherein the first and second filters comprise digital filters and the input signal comprises digital data.

7. A method of noise shaping in a delta-sigma modulator having first and second feedback loops and an output block including a shared quantizer simultaneously responsive to outputs of the first and second feedback loops and steering circuitry comprising:
    steering a first feedback stream from the quantizer to the first feedback loop under normal operating conditions, the first feedback loop having a first filter having a first signal transfer function;
    filtering first feedback signal with the first feedback loop under the normal operating conditions; and
    steering a second feedback stream from the quantizer to the first feedback loop and simultaneously a third feedback stream from the quantizer to the second feedback loop under overload conditions to maintain stability of the first feedback loop, wherein the second and third feedback streams substantially sum to a total feedback stream from the quantizer and the second filter has a second signal transfer function differing from the first signal transfer function.

8. The method of noise shaping of claim 7 wherein:
    filtering the input signal with the first filter under normal conditions comprises filtering the input signal with a higher order filter; and
    steering the third feedback stream to the second filter comprises steering the third stream to a lower order filter with proven stability under the overload conditions.

9. The method of noise shaping of claim 8 wherein the higher order filter has an order of at least three and the lower order filter has an order of two or less.

10. The method of noise shaping of claim 7 wherein steering the second and third feedback streams to the first and second filters comprises:
    generating the second feedback stream from the output stream of a non-limiting quantizer;
    generating a limited stream from the output of the non-limiting quantizer; and
    generating the third feedback stream from a difference between the second feedback stream and the limited stream.

11. The method of noise shaping of claim 7 wherein steering the second and third feedback streams comprises:
    generating the second feedback stream of a first polarity with sufficient energy to maintain stability of the first filter; and
    generating the third feedback stream with a second polarity to sum with the second feedback stream to substantially equal the total feedback stream from the quantizer.

12. The method of noise shaping of claim 7 wherein the input signal comprises a digital data stream.

13. The method of noise shaping of claim 7 further comprising:
    summing output streams of the first and second filters at an input of the quantizer under the overload conditions.

14. A delta-sigma data converter comprising:
    a delta-sigma modulator comprising:
    a first feedback loop including an input summer and a first filter of an order selected for filtering input first feedback signal under normal operating conditions;
    a second feedback loop including an input summer and a second filter of an order selected for passing energy during overload while remaining stable;
    a quantizer coupled to corresponding outputs of the first and second loops and simultaneously responsive to signals output from the first and second loops; and
    steering circuitry having a first output for driving the first loop and a second output for driving the second loop and operable to steer feedback to the summers of the first and second loops, wherein the steering circuitry steers the feedback such that the first loop passes a majority of the energy through the modulator under normal operating conditions and the second loop passes at least some of the energy through the modulator during overload.

15. The delta-sigma modulator of claim 14 further comprising a digital to analog converter coupled to an output of the delta-sigma modulator.

16. The delta-sigma modulator of claim 15 wherein the digital to analog converter comprises an output digital to analog converter and the delta-sigma converter comprises a delta-sigma digital to analog converter.

17. The delta-sigma converter of claim 14 wherein the first and second loops comprise digital loops.

18. The delta-sigma converter of claim 14 wherein the first and second loops comprise analog loops.

19. The delta-sigma converter of claim 14 wherein the first loop comprises a filter of at least a third order and the second loop comprises a filter of an order of two or less.

20. The delta-sigma converter of claim 14 wherein the quantizer comprises a non-limiting quantizer and a limiter.

* * * * *